US 6,731,155 B2

(12) United States Patent
Hakkarainen et al.

(10) Patent No.: US 6,731,155 B2
(45) Date of Patent: May 4, 2004

(54) TRACK AND HOLD WITH DUAL PUMP CIRCUIT

(75) Inventors: J. Mikko Hakkarainen, Palm Beach Gardens, FL (US); Kantilal Bacrania, Palm Bay, FL (US); Eric C. Sung, Palm Bay, FL (US); Hsin-Shu Chen, Melbourne, FL (US); Bang-Sup Song, La Jolla, CA (US); Mario Sanchez, Palm Bay, FL (US)

(73) Assignee: Intersil Americas Inc, Milpitas, CA (US)

( * ) Notice: Subject to any disclaimer, the term of this patent is extended or adjusted under 35 U.S.C. 154(b) by 0 days.

(21) Appl. No.: 10/308,775

(22) Filed: Dec. 3, 2002

(65) Prior Publication Data

US 2003/0151430 A1 Aug. 14, 2003

Related U.S. Application Data

(63) Continuation-in-part of application No. 10/097,677, filed on Mar. 13, 2002, now Pat. No. 6,570,523.
(60) Provisional application No. 60/356,610, filed on Feb. 13, 2002.

(51) Int. Cl.[7] .............................................. H03K 17/16
(52) U.S. Cl. ........................................ 327/390; 327/94
(58) Field of Search .............................. 327/91, 93, 94, 327/95, 96, 390, 536, 589

(56) References Cited

U.S. PATENT DOCUMENTS

6,188,346 B1   2/2001   Waho et al.
6,404,237 B1 * 6/2002   Mathew et al. ............. 326/113

OTHER PUBLICATIONS

Shu et al., "A 13–b, 10–Msample/ADC Digitally Calibrated with Oversampling Delta–Sigma Converter," IEEE Journal of Solid–State Circuits, vol. 30, No. 4, Apr. 1995, pp. 443–452, ISSN: 0018–9200/95.

Kwak et al., "A 15–b, 5–Msample/s Low–Spurious CMOS ADC," IEEE Journal of Solid–State Circuits, vol. 32, No. 12, Dec. 1997, pp. 1866–1875, ISSN: 0018–9200/97.

Fu et al., "A Digital Background Calibration Technique for Time–Interleaved Analog–to–Digital Converters," IEEE Journal of Solid–State Circuits, vol. 33, No. 12, Dec. 1998, pp. 1904–1911, ISSN: 0018–9200/98.

Erdogan, et al., "A 12–b Digital–Background–Calibrated Algorithmic ADC with −90–dB THD," IEEE Journal of Solid–State Circuits, vol. 34, No. 12, Dec. 1999, pp. 1812–1820, ISSN: 0018–9200/99.

Dyer, et al., "FA 9.3 Analog Background Calibration of a 10b 40MSample/s Parallel Pipelined ADC," IEEE International Solid–State Circuits Conference, IEEE 1998, pp. 9.3–1–9.3–11.

Fu, et al., "FA 9.2: Digital Background Calibration of a 10b 40MSample/s Parallel Pipelined ADC," IEEE International Solid–State Circuits Conference, IEEE 1998, pp. 9.2–1–9.2–11.

Choe, et al., "MP 2.2: A 13b 40MSample/s CMOS Pipelined Folding ADC with Background Offset Trimming," 2000 IEEE International Solid–State Circuits Conference, 07803–5853–8/00, 10 pages.

* cited by examiner

Primary Examiner—Jeffrey Zweizig
(74) Attorney, Agent, or Firm—Gary R Stanford

(57) ABSTRACT

A dual pump circuit including a transmission gate and a dual charge pump. The transmission gate includes a p-channel transistor and an n-channel transistor, each having a control terminal and a pair of current terminals coupled between a dual pump input and a dual pump output. The dual charge pump includes first and second pump circuits, where each pump circuit is coupled to the dual pump input and to a control terminal of a corresponding one of the transmission gate transistors. Each pump circuit is operative to linearize operation of its corresponding transmission gate transistor by maintaining VGS—VT constant. The dual pump circuit is used in a track and hold circuit including at least one dual pump sampling circuit, at least one sampling capacitor, and a control circuit for controlling input signal sampling timing. Each dual pump sampling circuit includes the transmission gate and a dual charge pump.

22 Claims, 5 Drawing Sheets

TRACK AND HOLD WITH DUAL PUMP CIRCUIT

CROSS-REFERENCE TO RELATED APPLICATION(S)

The present application is based on U.S. Provisional Patent Application entitled "An Analog To Digital Converter", Serial No. 60/356,610, filed Feb. 13, 2002, which is hereby incorporated by reference in its entirety. The present application is also a Continuation-In-Part of U.S. patent application entitled "An Analog To Digital Converter Using Subranging And Interpolation", Ser. No. 10/097,677, filed Mar. 13, 2002, now U.S. Pat. No. 6,570,523 which is also incorporated herein by reference in its entirety.

FIELD OF THE INVENTION

The present invention relates to sampling circuits, and more particularly to a high speed track and hold with dual pump circuit that may be used in a sampling circuit to achieve requisite high speed and accuracy.

DESCRIPTION OF RELATED ART

Many electronic functions employ sampling circuits for sampling an input signal. The present disclosure, for example, describes an analog to digital converter (ADC) that employs a sample circuit including at least one track and hold circuit to aid in comparison and digital conversion. It is noted that the present invention is not limited to ADC applications but may be applied to any application in which sampling circuits are employed and in which it is desired to maintain a requisite accuracy level. The desired level of linearity, accuracy and resolution of the particular ADC described herein is relatively high and requires 14-bit resolution of the output digital values. In this manner, it is desired that the track and hold circuit(s) used to sample an input signal maintain better than 14-bit accuracy.

The ADC is intended to be incorporated into a monolithic unit on one substrate of an integrated circuit (IC) or chip. The overall passive component match for most silicon processes is 0.1% in accuracy. This translates into overall accuracy of approximately 10 bits. Only a slight improvement is possible by careful optimization and use of dummy components in the layout of the passives. Sometimes, statistical matching using arrays of passives can yield up to an order of magnitude improvement in the overall accuracy.

Correction and calibration techniques are known to improve the resolution, such as laser trimming or fuse blowing. Such post-processing techniques, however, must be performed on a part-by-part basis thereby unduly complicating and increasing cost of the manufacturing process. Also, such post-processing techniques operate under fixed conditions and do not correct for inaccuracies or changes due to temperature, aging and/or operating conditions. Integrated calibration techniques are also known and usually operate to measure error at the backend and apply a correction factor. Such calibration techniques are limited by quantization and usually limit correction to one-half bit of resolution of the converter itself. Also, the calibration techniques are incorporated in silicon and thus subject to the same limitations of the target circuitry.

It is desired to provide a track and hold circuit that operates at relatively high speed while maintaining a relatively high level of accuracy. It is desired to meet these goals without being limited by accuracy limitations of the fabrication process and without interfering with or overly complicating the manufacturing process.

SUMMARY OF THE INVENTION

A dual pump circuit according to an embodiment of the present invention includes a transmission gate and a dual charge pump. The transmission gate includes a p-channel transistor and an n-channel transistor, where each transistor has a control terminal and a pair of current terminals coupled between a dual pump input and a dual pump output. The dual charge pump includes first and second pump circuits, where each pump circuit is coupled to the dual pump input and to a control terminal of a corresponding one of the transmission gate transistors. Each pump circuit is operative to linearize operation of its corresponding transmission gate transistor.

In one configuration, the p-channel transistor is a PMOS transistor and the first pump circuit is a PMOS charge pump circuit coupled to drive the gate of the PMOS transistor. Also, the n-channel transistor is an NMOS transistor and the second pump circuit is an NMOS charge pump circuit coupled to drive the gate of the NMOS transistor. The first and second pump circuits are each operative to maintain gate to source voltage minus the threshold voltage of a corresponding transmission gate transistor constant for a varying signal at the dual pump input. In one embodiment, the PMOS and NMOS transistors are approximately equal in size. In another embodiment, the PMOS and NMOS transistors each have approximately the same conductance.

A specific embodiment of the first and second pump circuits includes a source follower and a switched capacitor circuit. The source follower is coupled to the dual pump input and the switched capacitor circuit is coupled to the source follower circuit and to the control terminal of the corresponding transmission gate transistor. The switched capacitor circuit combines input voltage with a change in threshold voltage and controls the control terminal of the corresponding transmission gate transistor based on the combined voltage. The source follower circuit may include an operational amplifier coupled to the dual pump input, a MOS transistor having a control terminal coupled to an output of the differential amplifier and a pair of current terminals coupled between a supply voltage and an inverting input of the differential amplifier, and a constant current bias coupled to the inverting input of the differential amplifier. In this latter case, a gamma parameter of the MOS transistor and a corresponding one of the transmission gate transistors may be made approximately equal to provide threshold voltage compensation.

A track and hold circuit for sampling an input signal according to an embodiment of the present invention includes at least one dual pump sampling circuit, at least one sampling capacitor, and a sample control circuit. Each dual pump sampling circuit includes a transmission gate and a dual charge pump. The transmission gate includes a p-channel transistor and an n-channel transistor, where each transistor has a control terminal and a pair of current terminals coupled between the input signal and a sampling capacitor. The dual charge pump includes first and second pump circuits, where each has an input coupled to receive the input signal, an output coupled to a control terminal of a corresponding one of the p-channel and n-channel transistors, and an activation input. Each dual charge pump is configured to linearize operation of a corresponding one of the transmission gate transistors. The sample control circuit is coupled to activation inputs of each of the at least one dual pump sampling circuit and to each sampling capacitor. The sample control circuit is operative to activate the dual pump sampling circuit to sample the input signal via the at least one sampling capacitor, and then to deactivate each dual pump sampling circuit to provide a sampled output signal.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF EMBODIMENT(S) OF THE INVENTION

Figure 1:
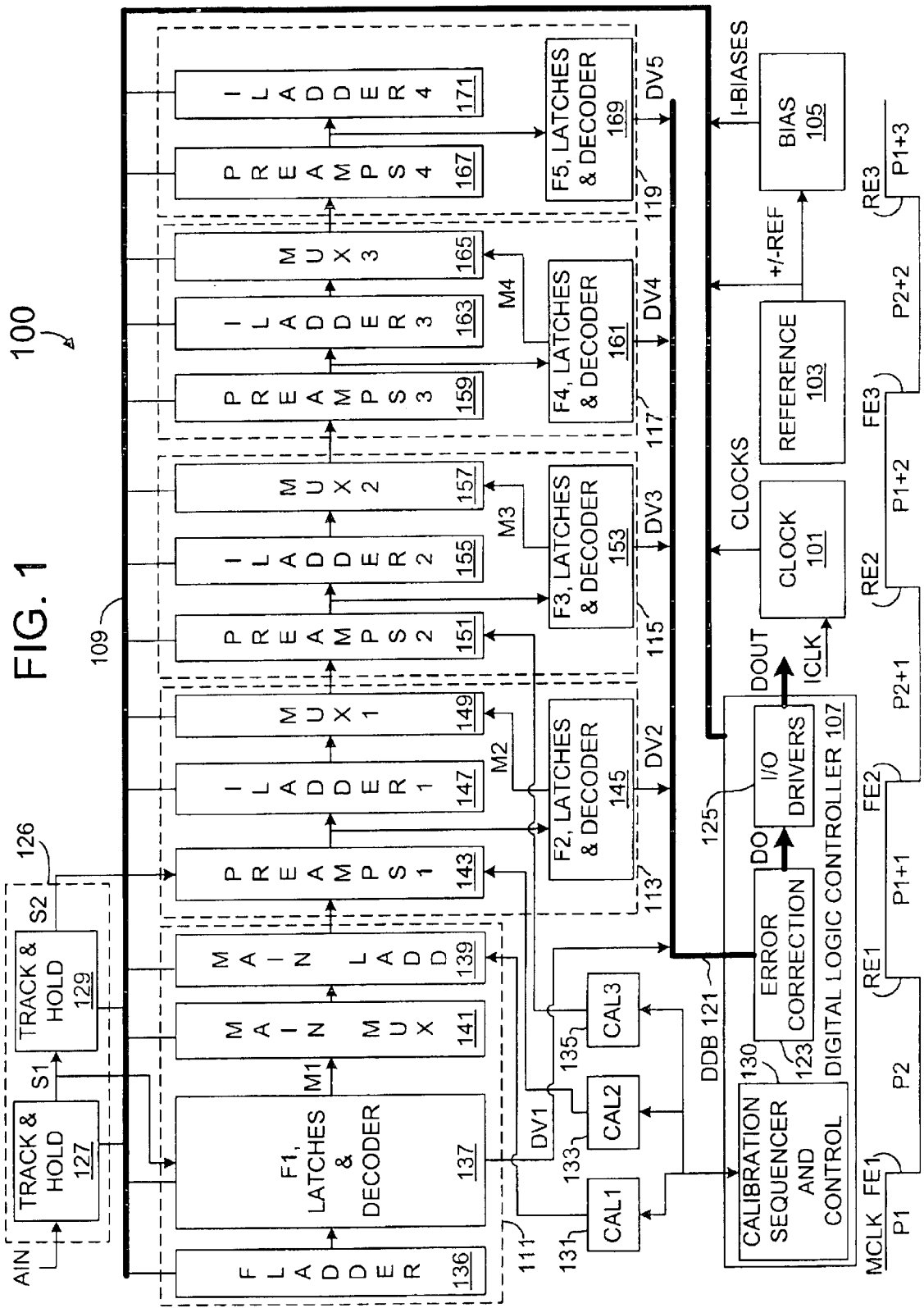
FIG. 1 is a block diagram of an exemplary analog to digital converter that is used to illustrate embodiments of the present invention.

FIG. 1 is a block diagram of an exemplary 14-bit analog to digital converter (ADC) 100 that is used to illustrate embodiments of the present invention. The ADC 100 includes support circuitry, such as a clock circuit 101, a reference circuit 103, a bias circuit 105 and a digital logic controller 107, all coupled together via a bias/clock bus 109. The clock circuit 101 receives an input clock signal ICLK and generates a plurality of clock signals "Clocks" for providing synchronization of the various components of the ADC 100. The reference circuit 103 generates reference voltage signals +REF and −REF that are sufficiently independent of temperature and power supply variations. The +/−REF signals are provided to the bias circuit 105, which develops a plurality of temperature-independent bias current signals "I-Biases" that provide current biasing for various components of the ADC 100 including preamplifiers within pipelined stages.

The signals of the bias/clock bus 109 are distributed to other components of the ADC 100 for purposes of control, synchronization, biasing and support. The bias/clock bus 109 is not necessarily organized as a single bus but instead includes analog and digital control signals that are collectively shown for purposes of simplifying description without departing from the spirit and scope of the present invention. Also, many of the signals and components described herein are differential in form throughout the pipelined architecture of the ADC 100, although the principles of the present invention may be applied in a similar manner to single-ended signals and components.

In the exemplary embodiment shown, the ADC 100 is configured as a pipelined architecture with multiple stages including a first input stage 111 and one or more secondary stages 113, 115, 117 and 119 that collectively convert an analog signal, referred to as "AIN", into an output digital value. The stages are loosely defined based on a series of sequentially-coupled flash converters 137, 145, 153, 161 and 169, where each flash converter includes latches and decoders as further described below. Each of the stages 111–119 develops a corresponding 4-bit digital value DV1, DV2, DV3, DV4 and DV5, respectively, which are collectively provided to an error correction circuit 123 within the digital logic controller 107 via a 20-bit digital data bus (DDB) 121.

The error correction circuit 123 converts the resulting 20-bit digital value on the DDB 121 into a 14-bit value referred to as "DO" to an input of a series of Input/Output (I/O) drivers 125. The I/O drivers 125 assert corresponding digital output signals, shown as "DOUT" signals, which are digital representations of the input analog signal AIN. The number of stages employed and the number of resolved bits per stage reflect the relative accuracy desired for the digital output. A different number of stages and/or number of resolved bits per stage may be used for different configurations or applications.

The ADC 100 includes a sample circuit 126 that regularly samples the AIN signal and that provides corresponding sample signals to the input stage 111. More particularly, the AIN signal is regularly sampled by a first track and hold circuit 127 for developing a first sample signal S1, which is provided to an input of a second track and hold circuit 129 and to an input of the first stage 111. The second track and hold circuit 129 samples the S1 signal at the same rate and asserts another sample signal S2 to an input of the second stage 113. In the exemplary embodiment illustrated, the clock circuit 101 asserts a master clock signal (MCLK) of approximately 80 MHz on the bias/clock bus 109. The track and hold circuit 127 samples the AIN signal at the MCLK rate and holds its output signal S1 at the sampled level for sampling by the track and hold circuit 129. The track and hold circuit 129 also samples the S1 signal at the MCLK rate and holds its output for use by the second stage 113. In the embodiment shown, the track and hold circuits 127, 129 operate in a make before break configuration so that the voltage level of the S1 signal is transferred to the S2 signal. Although a single master clock signal is shown (MCLK), separate sample and hold clocks may be used to enable make before break operation. In any event, the track and hold circuit 129 operates like a memory to hold one sample of the AIN signal for additional time while another sample of the AIN signal is being taken.

Each of the stages 111–119 includes a flash converter and at least one resistive ladder, where each flash converter includes latching comparators and a decoder. Each of the stages 111–117 includes select logic or a multiplexor (MUX) controlled by a corresponding flash converter for purposes of subranging the resistive ladders. Each of the stages 113–119 includes a set of preamplifiers for amplifying selected subranges. The resistive ladders each operate as an interpolator to divide a voltage range applied at the inputs or across the resistive ladder into intermediate voltages. The applied voltage range is either a reference signal (as in the first stage 111) or a residual signal from a prior stage.

The first stage 111 includes the first flash converter 137, a "flash" resistive ladder 136 (FLadder), a primary reference resistive ladder referred to as the "Main Ladder" 139 and a "Main" MUX 141 for selecting a subrange of the Main Ladder 139. The second stage 113 includes an array of preamplifiers 143 (Preamps1), the second (F2) 4-bit flash converter 145, a first interpolator resistive ladder (ILadder1) 147, and a MUX 149 (MUX1). The third stage 115 includes an array of preamplifiers 151 (Preamps2), the third (F3) 4-bit flash converter 153, a second interpolator resistive ladder (ILadder2) 155 and another MUX 157 (MUX2). The fourth stage 117 includes an array of preamplifiers 159 (Preamps3), the fourth 4-bit flash converter 161, a third interpolator resistive ladder 163 (ILadder3) and another MUX 165 (MUX3). The fifth and final stage 119 includes an array of preamplifiers 167 (Preamps4), the fifth (F5) 4-bit flash converter 169 and a fourth interpolator resistive ladder 171 (ILadder4). Although the ladders 147, 155, 163 and 171 are referred to as "interpolator" ladders referencing the interpolator function, each performs an additional function of averaging the voltage outputs of the preamplifiers 143, 151, 159 and 167, respectively, and thereby reducing any amplifier offsets. Also, the final ILadder4 171 is not needed to perform the interpolator function since it is at the end of the pipeline.

Selected components of the ADC 100 must be at least as accurate as the intended resolution of the ADC 100. In the particular embodiment shown, for example, the ADC 100 is a 14-bit converter, so that the track and hold circuits 127, 129 each have at least 14-bit accuracy. The Main Ladder 139 receives the +/−REF signal and develops a stack of intermediate reference voltage levels and is accurate to at least 14 bits in the embodiment shown. A calibration circuit 131 is provided for periodically calibrating the Main Ladder 139 to achieve and maintain the requisite accuracy. Calibration circuits 133 and 135 are provided for periodically calibrating the preamplifiers 143 and 151 to achieve and maintain the requisite level of accuracy. It is desired that remaining components have a relative or requisite degree of accuracy depending upon their functionality, design criterion and overall impact on the digital output value DOUT. The flash ladder 136, for example, has a relatively loose linearity requirement due to digital error correction and resolves only 4 bits at a time. The resistors of the flash ladder 136 and the flash converter 137 are designed to meet a speed specification (~80 MS/s) rather than accuracy. The flash converter 137 also only needs sufficient accuracy to resolve the 4 most significant bits and to select the appropriate subrange of the Main Ladder 139. Also, each of the flash converters 145, 153, 161 and 169 need only resolve 4 bits at a time. The digital logic controller 107 includes a calibration sequencer and control circuit 130 for controlling operation of the calibration circuits 131, 133 and 135. It is understood that each stage may be narrowed or widened to resolve less or more bits, respectively, for different applications.

In the exemplary embodiment shown, each of the five flash converters 137, 145, 153, 161 and 169 contribute a respective 4-bit digital or binary value, shown as DV1, DV2, DV3, DV4 and DV5, respectively, ranging from most significant to least significant, to the 20-bit DDB 121. In particular, the DDB 121 includes bit signals DDB(20 . . . 1) with DDB(20) being the most significant bit (MSB). The flash converter 137 provides DV1 as the MSB's DDB[20 . . . 17], the flash converter 145 contributes DV2 as the next bits DDB[16 . . . 13], the flash converter 153 contributes DV3 as the next bits DDB[12 . . . 9], the flash converter 161 contributes DV4 as the next bits DDB[8 . . . 5], and the flash converter 169 contributes DV5 as the least significant bits (LSB) DDB[4 . . . 1] of the DDB 121. The error correction circuit 123 regularly combines the 20 bits of the DDB 121 to generate the 14-bit DO value as further described below. The flash converters 137, 145, 153 and 161 each asserts a corresponding MUX select value M1, M2, M3 and M4, respectively, to the Main Mux 141, the MUX1 149, the MUX2 157 and the MUX3 165, respectively, for subranging the Main Ladder 139, the ILadder1 147, the ILadder2 155 and the ILadder3 163, respectively. The digital select values M1–M4 are related to the digital values DV1–DV4 according to a selected one of a number of possible coding schemes known to those skilled in the art. The format of the digital select values M1–M4 is chosen for the particular configuration and operation of the respective muxes, as further described below.

The flash ladder 136 comprises a fully differential resistor ladder using the +/−REF signals at either end to develop a sequential and differential stack of reference voltages. Each flash converter 137, 145, 153, 161 and 169 comprises a stack of comparators, each comparator consisting of a preamplifier and regenerative latch. During a first MCLK time period PI, the track and hold circuit 127 tracks the AIN signal. At a first falling edge (FE1) of the MCLK signal, the track and hold circuit 127 holds the S1 sampled signal to the flash converter 137. During the following MCLK period P2 between FE1 and the next rising edge of the MCLK signal (RE1), the flash converter 137 compares the S1 signal with each of the stack of reference voltages of the flash ladder 136. At the end of the MCLK period P2 at RE1, the flash converter 137 latches the flash preamplifier outputs and decodes the first 4-bit digital value DV1 representing the relative level of the S1 signal between the +/−REF signals. Since the S1 signal is expected to be within the +/−REF signal range and each flash preamplifier compares a corresponding interpolated reference signal with S1, the F1 flash converter 137 effectively decodes a transition point of the S1 signal in the range of the flash ladder 136.

The M1 value is provided to the Main MUX 141. At the next rising edge of the MCLK signal (RE1), beginning the MCLK period P1+1, the Main MUX 141 selects a subrange portion of the Main Ladder 139. The selected portion of the Main Ladder 139 includes sufficient overlap, as further described below, to ensure that the sampled signal is contained within the selected range and to provide digital redundancy for digital error correction. The Main Ladder 139 also receives the +/−REF signals at either end and comprises a series of primary resistors forming a resistor string, where each primary resistor is further divided by a subladder of resistors. In this manner, the +/−REF signals are finely divided into a sequential series of intermediate reference voltages by the Main Ladder 139. The Main MUX 141 comprises a switch matrix coupled to each of the subladder elements of the Main Ladder 139, and applies the selected portion or residual signal across first inputs of the Preamps1 143 during the P1+1 period. Meanwhile, the track and hold circuit 129 tracks the S1 signal during the MCLK period P2 and holds the S2 signal at the level of the S1 signal until FE2. The S2 signal, being a delayed equivalent of the originally sampled AIN signal, is applied to second inputs of the Preamps1 143. The Preamps1 143 comprise a stack of amplifiers having a predetermined gain for amplifying the difference between the S2 signal and a corresponding voltage level within the selected subrange of reference voltages from the Main Ladder 139.

During the MCLK period P1+1, the amplified residual signal from the Preamps1 143 is applied across the ILadder1 147 and to the inputs of the F2 flash converter 145. The ILadder1 147 interpolates the amplified residual signal, and the F2 flash converter 145 makes a digital decision based on the amplified residual signal to determine the second digital value DV2. The decode of the F2 flash converter 145 is similar to the decode performed by the F1 flash converter 137, and is based on a zero crossing point within the range of the ILadder1 147. At the next falling edge of the MCLK signal (FE2) beginning an MCLK period P2+1 between FE2 and the next rising edge (RE2), the F2 flash converter 145 latches the DV2 value, which is asserted on the DDB 121. The F2 flash converter 145 provides the M2 signal to the MUX1 149, where the M2 signal reflects the DV2 value. The MUX1 149 comprises a bank of switches coupled to the interpolation resistors of the ILadder1 147. During the P2+1 MCLK period, the MUX1 149 selects a portion of the ILadder1 147 and provides the selected portion across the inputs of the Preamps2 151. The M2 signal and the MUX1

149 are configured in such a manner that allows selection of an error correction band of approximately half the interpolation range on either side of the selected portion of the ILadder1 147. Although operation of the Preamps2 151 is similar to operation of the Preamps1 143, the Preamps2 151 do not amplify based on reference signals but instead amplify the differential output voltages of the selected portion of the ILadder1 147.

During the P2+1 MCLK period, The ILadder2 155 interpolates the amplified residual signal from the Preamps2 151, and the F3 flash converter 153 makes a digital decision based on the residual signal to determine the third digital value DV3 and the M3 value. The decode of the F3 flash converter 153 is similar to the F2 flash converter 145 based on a zero crossing point within the range of the ILadder2 155. At RE2 beginning an MCLK period P1+2 between RE2 and the next falling edge (FE3), the F3 flash converter 153 latches the DV3 value on the DDB 121 and generates the M3 value, which is provided to the MUX2 157. The MUX2 157 also comprises a bank of switches which are coupled to the interpolation resistors of the ILadder2 155, and the M3 value and MUX2 157 are configured to select an error correction band of approximately half the interpolation range on either side of the selected portion of the ILadder2 155. During the P1+2 MCLK period, the MUX2 157 selects a portion of the ILadder2 155 and provides the selected portion across the inputs of the Preamps3 159. The Preamps3 159 amplify the differential outputs of the selected portion of the ILadder2 155.

Configuration and operation of the next stage 117 is similar to the stage 115, where the ILadder3 163 interpolates the amplified residual signal from the Preamps3 159, and the F4 flash converter 161 makes a digital decision based on the residual signal to determine the fourth digital value DV4 and the M4 value. At FE3 beginning an MCLK period P2+2 between FE3 and the next rising edge (RE3), the F4 flash converter 161 latches the DV4 value, provides the M4 value to the MUX3 165 and asserted on the DDB 121. The MUX3 165 selects a portion of the ILadder3 163 and provides the selected portion across the inputs of the Preamps4 167, which amplify the differential outputs of the selected portion of the ILadder3 163.

In the final stage 119, the ILadder4 171 receives the amplified residual signal from the Preamps4 167. The ILadder4 171, however, does not include interpolation switches since the end of the pipeline has been reached, although it performs the averaging function for the Preamps4 167 as previously described. The F5 flash converter 169 makes a digital decision based on the residual signal to determine the fifth digital value DV5, which is latched onto the DDB 121 at RE3. At FE2, the track and hold circuit 127 holds the next sample on the S1 signal provided to the flash converter 137. At RE2, the flash converter 137 latches and decodes the next 4-bit digital value DV1 as the first digital value of the next sample of the AIN signal. Operation proceeds in this manner so that the error correction circuit 123 receives a completely new set of digital values DV1–DV5 at the next rising edge (not shown) of MCLK after RE3. In this manner, a new set of digital values is received by the error correction circuit 123 after each subsequent rising edge of the MCLK signal. New samples are continuously propagated in a synchronous manner at the sampling rate through the stages 111–119 so that the DOUT value tracks the AIN signal. A relatively insignificant delay of 3 MCLK cycles initially occurs to fill the stages of the pipeline, so that the DOUT signal is the digital representation of the AIN signal with a latency of 3 clock cycles.

Figure 2:
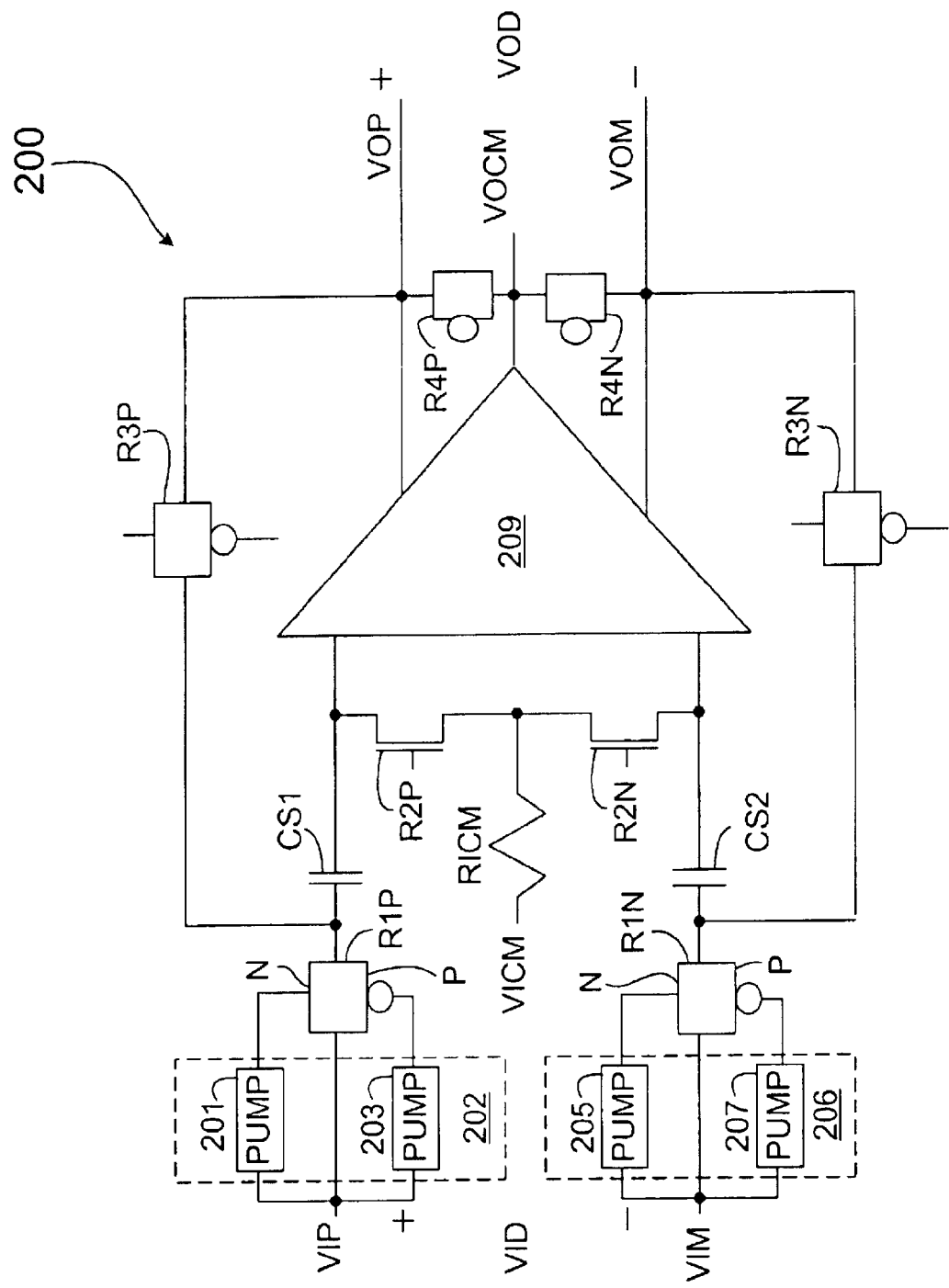
FIG. 2 is simplified block diagram of an exemplary track and hold circuit that may be used as either or both of the first and second track and hold circuits of FIG. 1.

FIG. 2 is a simplified block diagram of an exemplary track and hold circuit 200 that may be used as either or both of the first and second track and hold circuits 127, 129. The track and hold circuit 200 receives a differential input signal Vid including positive (+) and negative (−) input components Vip and Vim, respectively, and provides a differential output signal Vod including positive (+) and negative (−) components Vop and Vom, respectively. The Vid and Vod signals represent the AIN and S1 signals, respectively, for the first track and hold circuit 127 or the S1 and S2 signals, respectively, for the second track and hold circuit 129. Most of the switching devices illustrated in the exemplary embodiments herein are formed using metal-oxide semiconductor (MOS) devices such as n-channel MOS (NMOS) transistors, p-channel MOS (PMOS) transistors or even Complementary MOS (CMOS) devices or the like. The control signals used to control switching are provided from the bias/clock bus 109 from the digital logic controller 107 and/or the clock circuit 101 or are derived from such signals to perform the indicated functions. Many of the actual control signals are not shown or described in detail since their configuration and operation are readily known and understood by those reasonably skilled in the art.

The Vip signal is provided to the inputs of each of two charge pumps 201, 203 and to the source terminal of a switched resistor input sampling switch or transmission gate R1p. The transmission gate R1p is formed by a p-channel and n-channel device coupled together and controlled by the dual pumps 201 and 203. In the embodiment shown, the transmission gate R1p is formed by an NMOS transistor "N" and a PMOS transistor "P" having their sources and drains coupled together. The sources form a pump input receiving the Vip signal and the drains form a pump output. The gate of the NMOS transistor N of the transmission gate R1p is coupled to the output of the charge pump 201 and the gate of the PMOS transistor P is coupled to the output of the charge pump 203. The output (drains) of the transmission gate R1p is coupled to one side of a sample capacitor Cs1 and to the input of another switched resistor feedback resistive switch R3p. The Vim signal is coupled in a similar manner to the inputs of two different charge pumps 205, 207 and to the input of another input transmission gate R1n on the negative side. The transmission gate R1n is formed by an NMOS transistor N and a PMOS transistor P in the same manner as described above for the transmission gate R1p. The output of charge pump 205 is coupled to the gate of the transistor N and the output of charge pump 207 is coupled to the gate of the PMOS transistor P of the transmission gate R1n. The output (drains) of the transmission gate R1n is coupled to one side of another sample capacitor Cs2 and to the input of another feedback resistive switch R3n on the negative side. The pair of charge pumps 201 and 203 form a dual charge pump 202 and the pair of charge pumps 205 and 207 form a dual charge pump 206. The resistive switches R3p and R3n are formed in a similar manner as the transmission gates R1p and R1n, except that they are not driven by charge pumps in the embodiment shown. The MOS transistors forming the transmission gates R1p and R1n are approximately the same size in one embodiment for non-linearity cancellation.

The opposite side of the capacitor Cs1 is coupled to the inverting input of an operational transconductance amplifier (OTA) 209 and to one end of a common mode resistive switch R2p. The OTA 209 is a fully differential amplifier having a differential input and a differential output. The present invention, however, is contemplated for single polarity configurations as well. The opposite side of the capacitor Cs2 is coupled to the non-inverting input of the OTA 209 and to one side of a common mode resistive switch R2n. The other sides of the resistive switches R2p and R2n are coupled together and to an input common-mode voltage source, Vicm, which has output resistance Ricm. The output of the switched resistor R3p is coupled to the non-inverting output of the OTA 209 and to one side of an output common mode resistive switch R4p. The output of the resistive switch R3n is coupled to the inverting output of the OTA 209 and to one side of another output common mode resistive switch R4n. The other sides of each of the resistive switches R4p, R4n receive an output common mode voltage Vocm. The output signals Vop, Vom forming the differential output signal Vod are developed at the non-inverting and inverting outputs, respectively, of the OTA 209.

The transmission gates R1p and R1n are controlled by switching action of the dual charge pumps 202 and 206 as further described below. Separate control signals (not shown) control the switching of the resistive switches R2p, R2n, R3p, R3n, R4p, and R4n.

The track and hold circuit 200 employs a flip-around sampling technique including a sample phase and a hold phase. In the sample phase, the transmission gates R1p, R1n and resistive switches R2p, R2n and R4p, R4n are switched on while the feedback resistive switches R3p, R3n are switched off. This causes the differential input signal Vid to be sampled onto the two sampling capacitors Cs1, Cs2 while the output signals Vop, Vom are reset to Vocm. In particular, the capacitor Cs1 samples Vip-Vicm and the capacitor Cs2 samples Vim-Vicm. In the hold phase, the feedback resistive switches R3p, R3n are switched on while the transmission gates R1p, R1n and other resistive switches R2p, R2n and R4p, R4n are switched off. In this manner, the voltages stored on the capacitors Cs1, Cs2 are switched to the outputs of the OTA 209. In the particular configuration, the resistive switches R2p, R2n are turned off slightly before the transmission gates R1p, R1n since the resistive switches R2p, R2n connect to a DC voltage source so that the relative turn-off time of each of the resistive switches R2p, R2n does not depend on the input voltage Vid. Once the resistive switches R2p, R2n are switched off, the capacitors Cs1, Cs2 have already sampled the input at that precise moment onto respective capacitor plates; because of charge conservation, this amount does not change until the resistive switches R2p, R2n are switched on again.

The input is fully differential so that the input polarity signals Vip, Vim are sampled on the two separate sampling capacitors Cs1, Cs2, respectively. Each input signal is sampled onto a sampling capacitor by connecting one capacitor plate to the input through respective gates R1 and the other capacitor plate to a convenient bias voltage Vicm through respective resistive switches R2. This allows one side of each Cs to be connected to a voltage that biases the OTA 209 input at the most favorable level. In other words, the sampling capacitors Cs1, Cs2 provide DC blocking which allows liberty in selecting the input common mode level of the OTA 209. The input common mode voltage does not need to move with the signal and does not need to be related to the output common mode. The sampling network for each input can be modeled as a simple R/C circuit, where R is the sum of the resistance of the resistive switches R1, R2 and Ricm and C is that capacitance of the capacitors Cs1, Cs2 together with any parasitic capacitances.

One advantage of the flip-around sampling technique is that sampling is done with a simple and fast R/C network and the hold mode is accomplished with a unity feedback factor for the OTA 209, maximizing its closed-loop bandwidth. A possible disadvantage is that the amplifier offset is not cancelled, adding some system level complexity. This is acceptable in high-speed applications, however, since analog offset cancellation techniques tend to decrease the dynamic performance of the sample and hold. Speed and linearity concerns usually override the need to perform offset cancellation at the circuit level. The outputs of the OTA 209 are reset to Vocm to keep them from drifting to either power supply during sample mode. While this is desired to continuously maintain the amplifier in its high-gain region, a modest disadvantage is that the input signal and the amplifier output common modes should be nearly equal so that the amplifier outputs do not undergo a severe common mode change when transitioning from sample mode to hold mode.

In one specific configuration, it is desired to achieve a conversion rate of 80 mega symbols per second (MSPS) with a resolution of 14 bits having an input 3 decibel (dB) bandwidth greater than 100 megahertz (MHz) with a signal to noise ratio (SNR) greater than 75 dB and a spurious free dynamic range (SFDR) of about 90 dB or greater at an input frequency of 1 MHz. There exists a trade-off between faster but noisier settling versus slower settling with cleaner output. The size of the capacitors Cs1, Cs2 affects SFDR. While larger capacitors yield a higher SNR, the opposite is usually true for SFDR. A smaller capacitive load (at the input or compensation) allows a larger effective bandwidth, implying potentially faster settling, which improves linearity. The illustrated application places more emphasis on fast settling higher linearity or SFDR, so that relatively small input and load (compensation) capacitors should be used. Because the equivalent capacitor that would produce a 75 dB thermal noise is very small (e.g., 22 fempto Farads (fF)), thermal noise is not a limiting factor for the SNR target. It is therefore possible to focus on the SFDR performance by selecting optimum capacitor values based on considerations other than thermal noise. To achieve the desired SFDR, the capacitors are selected to optimize output settling behavior. In the embodiment shown, the capacitors Cs1 and Cs2 are each approximately 1–2 picofarads (pF).

The initial condition is not zero for each sample but instead the initial condition equals the previously sampled value. Consequently, to avoid non-linearity caused by varying initial conditions, the sampling network should have a relatively fast time constant. For the given specifications, this corresponds to a 3 dB bandwidth of about 300 MHz for the R/C circuit. Assuming that the capacitors Cs1 and Cs2 are each approximately 1 pF, the total maximum sampling resistance is also limited to a relatively small value and is based on a time constant number k (e.g., Rmax=k/5,000 ohms ($\Omega$)). Each unit increase in k provides a corresponding increase of SFDR of approximately 10 dB. Thus, reducing the sampling switch resistance is beneficial and has an implication for the configuration of the charge pumps 201–207.

The input bias source is illustrated by a voltage source Vicm in series with a resistance Ricm, which connects to the OTA 209 input side resistive switches R2p, R2n. Because R2 and Ricm are part of the input sampling network, their values are as important as the resistance of the input switch or transmission gates R1. The bias point of the resistances R2 and Ricm is always the same regardless of input level, but nonetheless contribute to non-linearity. Although R2 can be reduced by increasing the size of the transistor, decreasing resistance also increases the charge injection amount, so that resistance (R) is traded for Q linearly. The issue is two-fold, one to find an optimal point where input bandwidth and charge injection effects are balanced, or two to develop a method for compensating for charge injection. Both are difficult tasks and can be determined by experimentation. The resistance values for the resistive switches R2 is made large enough to achieve a desired sampling time constant, but small enough to achieve minimum charge injection.

Ricm can be reduced basically by burning more power in the circuit that develops Vicm. While there may be some circuit tricks to reduce the low frequency output impedance of a circuit, such as by using an operational amplifier (op amp) in negative feedback, high-frequency impedance is of primary concern. Consequently, at high speeds it is most likely that the impedance of almost any circuit is its open-loop impedance. It may therefore be best to use all available power to design the simplest low impedance open-loop block rather than using power in a feedback structure. Assuming this to be true, a simple source follower circuit is a good choice for Vicm. A simple calculation reveals that a 5 milliamps (mA) current into a 500 microamps ($\mu$m)/0.5 $\mu$m NMOS device yields an AC impedance (1/gm) of about 25 $\Omega$, which should be low enough not to burden R1 and R2.

In order to maximize settling performance (and thus speed), conventional wisdom suggests maximizing the OTA gain-bandwidth product (unity gain bandwidth), with "reasonable" phase margin. In conventional practice, a 60 degree phase margin is considered sufficient, if not ideal, and slippage to 50–55 degrees is tolerated for gains in bandwidth. In fact, most analog designers would probably rather choose an OTA with 60 degree phase margin but 1.5 times (1.5×) the bandwidth over a 75 degree phase margin, 1×bandwidth case. In other words, bandwidth is considered to be relatively more important than phase margin.

It has been determined, however, that the opposite is true. A two-pole open-loop amplifier (with no zeros) and with a 76.345 degree phase margin corresponds to a critically damped closed-loop amplifier. This is the smallest open-loop phase margin with no peaking and no ringing in the closed-loop settling characteristic, and turns out to be about the best design choice from a linearity point of view. When settling to 14-bits (0.5 LSB level) with a fixed unity gain frequency for the OTA 209, phase margin equal to 76 degrees settles about 3 times faster than a phase margin of 45 and about 2 times faster than a phase margin of 60. Alternatively, a 1×bandwidth with a phase margin of 76 does about as well as a 2×bandwidth with a phase margin of 60 or 3×bandwidth with a phase margin of 45. Optimization of phase margin is desirable. Furthermore, because bandwidth depends on gm, deviation from the ideal phase margin is very costly in power. Simulations have revealed a strong dependence of settling time on phase margin. Despite the "ideal" nature of the simulation models, the dramatic dependence on phase margin should not be ignored. Spectre and Matlab simulations suggest that a 76 degree phase margin with a little over 200 MHz bandwidth should settle to 0.5 LSB at 14-bits in 5 ns.

An exemplary architecture for the OTA 209 is a telescopic triple cascode. The telescopic structure has the highest speed potential because its parasitic capacitances are the lowest, yielding the highest potential second pole frequency. Note that in a two-pole amplifier the second pole is the sole determining factor of phase margin and thus dictates how high the unity gain frequency can be pushed. While its AC performance is superior, the telescopic OTA suffers from two general disadvantages. First, the input common mode range is extremely limited. This is not a problem in switched capacitor circuits, however, because the capacitors can "block" DC voltages and the OTA input can be operated in a narrow desirable bias region. Second, common mode feedback tends to have an offset component because the input pair current source necessarily has a low output resistance as the triple cascode forces it to have a low drain to source voltage VDS. The bias current is thus sensitive to shifts in VDS that result from shifts in input common mode, which in turn are caused by charge injection from the input bias switch (R2). An improvement would be to provide an OTA topology with more headroom for the current source. In the illustrated embodiment, the switch charge injection is canceled with dummy devices, keeping systematic common-mode offset to a minimum. Random common mode offset should not be too large to be very important at the 14-bit level.

Figure 3:
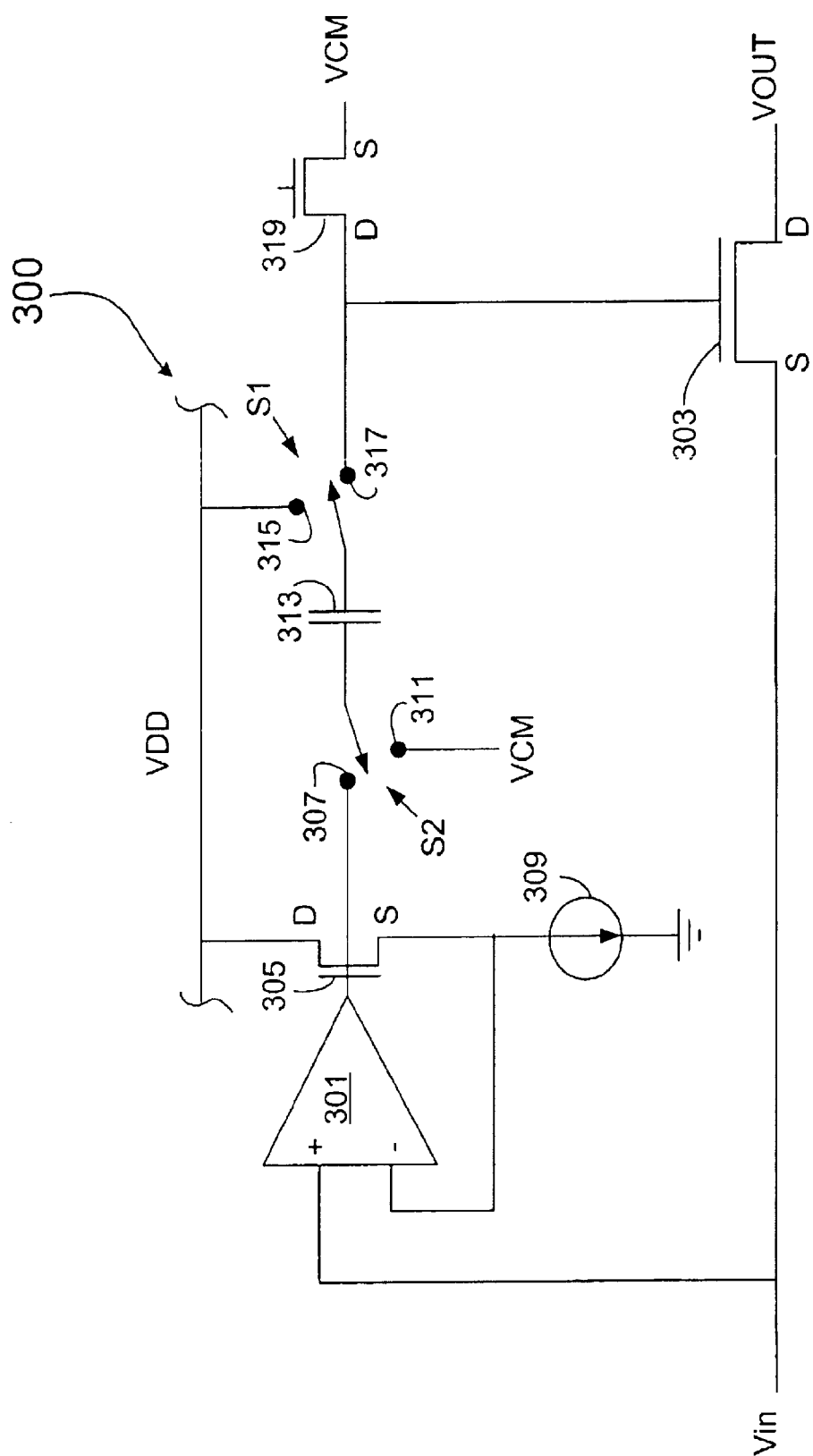
FIG. 3 is a simplified schematic diagram of a polarity-neutral charge pump which may be used as the basis for any of the charge pumps of FIG. 2.

FIG. 3 is a simplified schematic diagram of an exemplary NMOS charge pump 300, which may be used as the basis for either of the pump circuits 201 or 203. The PMOS charge pumps 205 and 207 are similar and operate in a similar manner and will not be described in detail. An input voltage Vin is provided to the non-inverting input of an OTA 301 and to the source of a MOS transistor 303, which represents any corresponding one of the NMOS or PMOS transistors of the transmission gates R1n, R1p (thus shown without arrows). The output of the OTA 301 is coupled to the gate of another MOS transistor 305 and to one throw terminal 307 of a single-pole, double-throw switch S2. The drain of the FET 305 is coupled to a source voltage Vdd and the source of the FET 305 is coupled to an input of a bias constant current sink 309 and to the inverting input of the OTA 301. The output of the current sink 309 is coupled to a common voltage terminal, such as ground. The other throw terminal 311 of the switch S2 receives a common mode voltage Vcm. The center pole of the switch S2 is coupled to one side of a capacitor 313, having its other side coupled to the center pole of another single-pole, double-throw switch S1. One throw terminal 315 of the switch S1 is coupled to receive Vdd and the other throw terminal 317 is coupled to the drain of a MOS transistor 319 and to the gate of the MOS transistor 303. The source of the MOS transistor 319 receives the Vcm signal. The source of the FET 303 receives the Vin signal and its drain develops an output signal Vout.

The MOS transistor 319 and the switches S1 and S2 are controlled by control clock signals (not shown) directly or indirectly via signals from the bias/clock bus 109 as previously described. The pump circuits are operated in a periodic manner using the control clock signals to perform the sampling functions, in which each pump is activated during one portion of each cycle and deactivated during the remaining portion of each cycle. The switches S1, S2 operate so that switch S1 couples to Vdd via terminal 315 while switch S2 couples to Vcm via terminal 311 to charge the capacitor 313 with a voltage Vdd-Vcm. Also, the MOS transistor 319 is turned on to apply the voltage Vcm to the gate of the transmission gate transistor 303. Then the switches S1, S2 are switched to their other terminals 317 and 307 to drive the transmission gate transistor 303 to provide an output to the corresponding sampling capacitor, while the MOS transistor 319 is turned off.

In operation, the capacitor 313 samples a voltage of about ½ Vdd, which becomes the pump's overdrive to the corresponding input resistive switch (R1p or R1n). The unity gain follower OTA 301 uses a source follower output stage formed by the MOS transistor 305, passing its gate as the output, which adds a VGS voltage to the overdrive voltage on the capacitor 313. Since the source follower has a constant current, its VGS is equal to its VT plus a constant, which adds to the overdrive of the capacitor 313. The OTA 301 forces the source follower transistor 305 to have the same source voltage "VS" as the corresponding transmission gate transistor being driven. In this manner, as long as the gamma parameters of the MOS transistors 303 and 305 are approximately equal, their threshold voltages VT track each other to provide VT compensation. Thus the input switch VT effect is cancelled and the total overdrive becomes ½ Vdd plus a small constant. Each pump circuit 201, 203, 205 and 207 operates to track the input voltage polarity signal (Vip or Vim) and combine the input signal plus a small differential or delta which accounts for any differential in the VT voltage due to the body effect. The voltage of the control terminal (gate) of the corresponding transmission gate transistor is controlled to keep its VGS-VT constant.

One purpose of the dual charge pumps 202 and 206 is to provide a maximum amount of overdrive to the input transmission gates R1p and R1n, respectively, which reduces their resistance and time constants and thus improve SFDR. Another purpose of the dual charge pumps 202 and 206 is to keep the VGS-VT of the transmission gate transistors as constant as possible, where VGS is the gate to source voltage of a corresponding transmission gate transistor and VT is the corresponding threshold voltage. Keeping VGS-VT constant keeps the on resistance of the resistive switches constant, which helps by ensuring a time constant that is independent of the input signal. Keeping the VGS-VT of the transmission gate transistor constant further reduces or otherwise eliminates an input-independent charge injection error (i.e. constant error) at the input side of the OTA 209.

The use of a pumped transmission gate (NMOS and PMOS) rather than a single pumped NMOS or PMOS gate as the input resistive switches R1p and R1n provides several advantages. If the parasitic drain and source capacitances of the NMOS and PMOS devices are roughly equal, then in operation, their non-linearities cancel. This happens because as the input swings up and down, the voltage dependent parasitic capacitance of the NMOS device decreases while the voltage dependent parasitic capacitance of the PMOS device increases and vice versa. Thus it is possible to find a condition where their sum remains constant, which can be achieved by device sizing and choice of input common mode voltage. While the best case can be determined experimentally, simulations have shown that optimum cancellation occurs when the NMOS and PMOS device are roughly equal in size and not necessarily ratioed by their relative mobilities or transconductances. Further, it has been found that this relationship is only a relatively weak function of size, so that precise size matching is not necessary or paramount. One desired approach is to make the NMOS device as large as necessary to achieve the requisite turn on resistance RON, and then add a PMOS device having roughly the same size in parallel with the NMOS device to cancel the parasitic capacitance. Simulations have shown that the use of a pumped transmission gate with equal-sized NMOS and PMOS devices using VT compensation provides the highest SFDR.

The on-resistance (RON) of an NMOS transistor or of a PMOS transistor is a nonlinear function of the applied input voltage. The RON function of the NMOS transistor is similar yet complementary to the RON function of the PMOS transistor as a function of input voltage. Thus, the complementary structure of the transmission gates R1p and R1n effectively place the resistive switches in parallel forming a substantially more linear combined or complementary RON. The dual pump circuits 201, 203 and 205, 207 are operative to further linearize operation of each of the NMOS and PMOS transistors by maintaining a relatively constant VGS voltage in response to varying or changing input voltage. In general, each pump circuit includes a source follower and switched capacitor circuit that combines the input voltage with a common mode voltage and that controls the gate of the corresponding transmission gate transistor based on the combined voltage.

The NMOS and PMOS transistors of each of the dual transmission gates R1p and R1n have been described as having their sources receiving an input signal and their drains providing an output signal. The terms "source" and "drain" for either polarity of the MOS transistors depend on the voltage potentials. For an NMOS transistor, the drain is the terminal with the higher potential. When used as a switch, such as is the case for the transmission gates R1p and R1n, the terminals can change from sample to sample. In this manner, the "arrow" is usually not shown for the NMOS or PMOS transistors used for a switch. The drain and source terminals may collectively be referred to as first and second current terminals regardless of their relative positioning in a given circuit, where the gate is referred to as the control terminal. In this manner, it is not intended to limit the invention to any particular connection configuration of the current terminals, where the sources and drains of either of the NMOS and PMOS transistors may be switched without departing from the spirit or scope of the present invention. During sample mode, current flows into or out of an input current terminal (depending on the initial conditions), eventually resulting in equal voltage potentials at the two current terminals. Therefore, it is still correct to use "VGS" to describe either of the NMOS or PMOS pump functions.

Figure 4A:
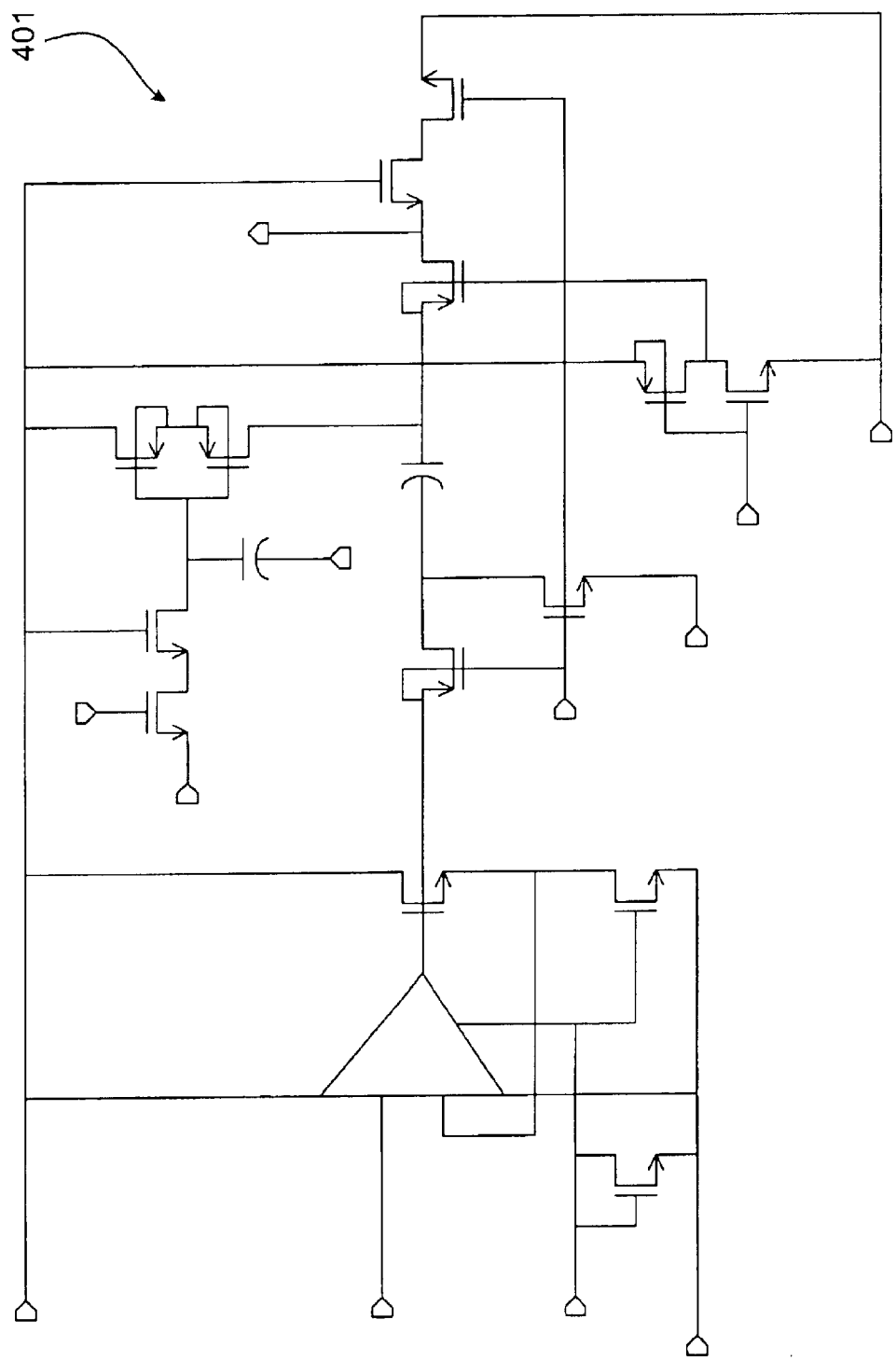
FIG. 4A is a more detailed schematic diagram of an exemplary NMOS pump that may be used as the NMOS charge pumps of FIG. 2.
Figure 4B:
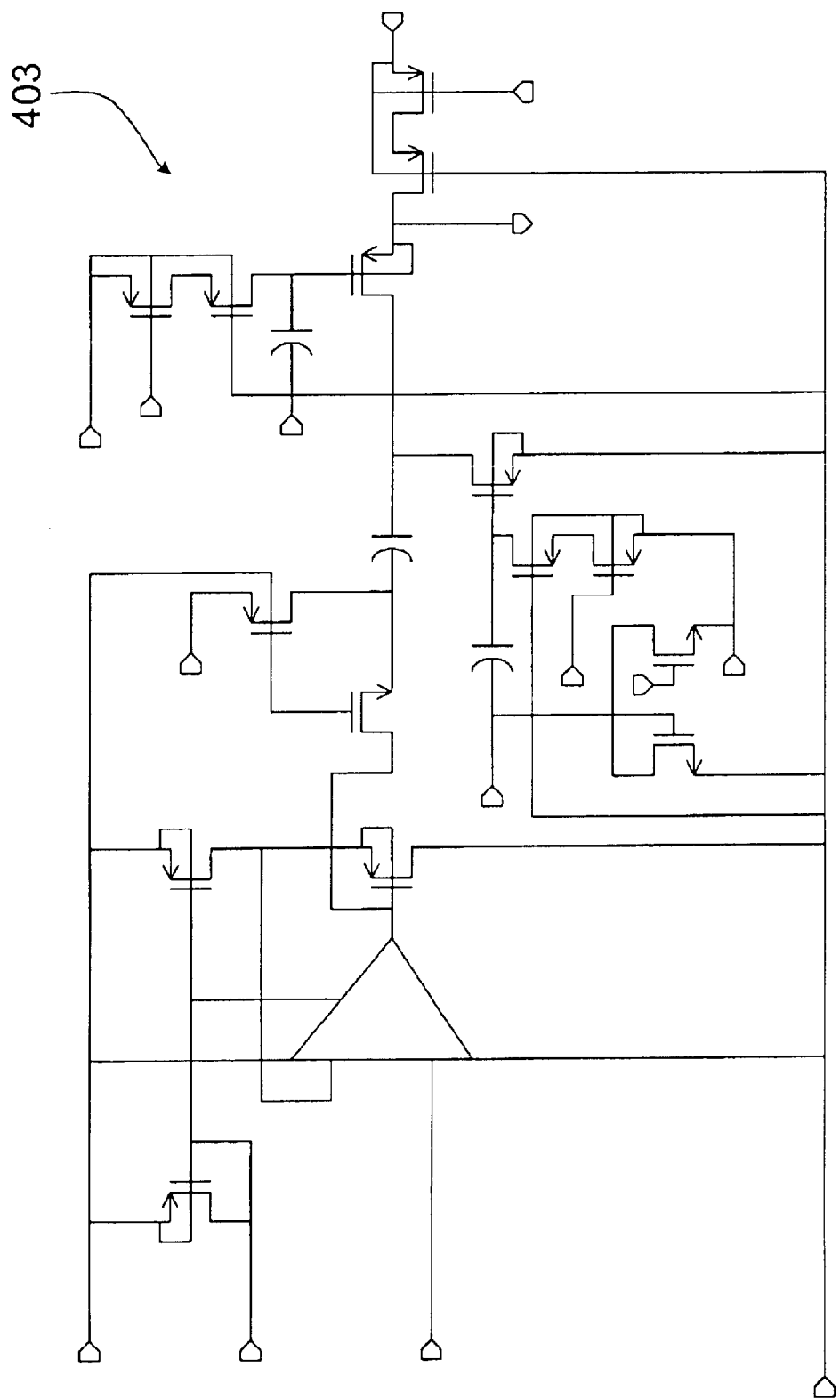
FIG. 4B is a more detailed schematic diagram of an exemplary PMOS pump that may be used as the PMOS charge pumps of FIG. 2.

FIG. 4A is a more detailed schematic diagram of an exemplary NMOS pump 401 that may be used as the charge pumps 201 and 205 and FIG. 4B is a more detailed schematic diagram of an exemplary PMOS pump 403 that may be used as the charge pumps 203 and 207. Operation of each of the pumps 401 and 403 is similar to that described above for the exemplary charge pump 300.

Many modifications and other embodiments of the invention will come to mind of one skilled in the art having the benefit of the teachings presented in the foregoing descriptions and the associated drawings. Although a system and method according to the present invention has been described in connection with one or more embodiments of the invention, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A dual pump circuit having an input and an output, comprising:
    a transmission gate including a p-channel transistor and an n-channel transistor, each transistor having a control terminal and a pair of current terminals coupled between the dual pump input and the dual pump output; and
    a dual charge pump including first and second pump circuits, each coupled to the dual pump input and to a control terminal of a corresponding one of the transmission gate transistors and operative to linearize operation of the corresponding transmission gate transistor.

2. The dual pump circuit of claim 1, wherein the p-channel transistor is a PMOS transistor, wherein the first pump circuit comprises a PMOS charge pump circuit coupled to drive a gate of the PMOS transistor, wherein the n-channel transistor is an NMOS transistor, and wherein the second pump circuit comprises an NMOS charge pump circuit coupled to drive a gate of the NMOS transistor.

3. The dual pump circuit of claim 2, wherein the first and second pump circuits are each operative to maintain gate to source voltage minus threshold voltage of a corresponding transmission gate transistor constant for a varying signal at the dual pump input.

4. The dual pump circuit of claim 2, wherein the PMOS and NMOS transistors are approximately equal in size.

5. The dual pump circuit of claim 2, wherein the PMOS and NMOS transistors each have approximately the same conductance.

6. The dual pump circuit of claim 1, wherein each of the first and second pump circuits comprise:
   a source follower circuit coupled to the dual pump input; and
   a switched capacitor circuit, coupled to the source follower circuit and to the control terminal of the corresponding transmission gate transistor, that combines input voltage with a change in threshold voltage and that controls the control terminal of the corresponding transmission gate transistor based on the combined voltage.

7. The dual pump circuit of claim 6, wherein the source follower circuit comprises:
   an operational amplifier having a non-inverting input coupled to the dual pump input, an inverting input and an output;
   a MOS transistor having a control terminal coupled to the output of the differential amplifier and a pair of current terminals coupled between a supply voltage and the inverting input of the differential amplifier; and
   a constant current bias coupled to the inverting input of the differential amplifier.

8. The dual pump circuit of claim 7, wherein a gamma parameter of the MOS transistor and a corresponding one of the transmission gate transistors is approximately equal to provide threshold voltage compensation.

9. The dual pump circuit of claim 7, wherein the switched capacitor circuit comprises:
   a capacitor; and
   first and second switches coupled on either end of the capacitor, that charge the capacitor with a common mode voltage in a first position and that couple the capacitor between the output of the differential amplifier and the control terminal of the corresponding transmission gate transistor in a second position.

10. The dual pump circuit of claim 9, wherein the switched capacitor circuit further includes a switch that couples the control terminal of the corresponding transmission gate transistor to the common mode voltage while the switched capacitor circuit capacitor is being charged.

11. A track and hold circuit for sampling an input signal, comprising:
   at least one sampling capacitor;
   at least one dual pump sampling circuit, each comprising:
       a transmission gate including a p-channel transistor and an n-channel transistor, each transistor having a control terminal and a pair of current terminals coupled between the input signal and a pump output; and
       a dual charge pump including first and second pump circuits, each having an input coupled to receive the input signal, an output coupled to a control terminal of a corresponding one of the p-channel and n-channel transistors, and an activation input, and each configured to linearize operation of a corresponding one of the transmission gate transistors; and
   a sample control circuit coupled to activation inputs of each of the at least one dual pump sampling circuit and to each sampling capacitor, the sample control circuit operative to set common-mode voltage on each sampling capacitor, to activate the dual pump sampling circuit to sample the input signal via each sampling capacitor, and then to deactivate each dual pump sampling circuit to provide a sampled output signal.

12. The track and hold circuit of claim 11, wherein each of the first and second pump circuits of each dual charge pump comprises:
   a source follower circuit coupled to receive the input signal; and
   a switched capacitor circuit, coupled to the source follower circuit and to the control terminal of a corresponding one of the transmission gate transistors, that combines an input voltage level with a threshold voltage differential and that controls the control terminal of the corresponding transmission gate transistor based on the combined voltage.

13. The track and hold circuit of claim 12, further comprising:
   the source follower circuit comprising:
       a operational amplifier having a non-inverting input coupled to receive the input signal, an inverting input and an output;
       a metal oxide semiconductor (MOS) transistor having a control terminal coupled to the output of the operational amplifier and a pair of current terminals coupled between a supply voltage and the inverting input of the operational amplifier; and
       a current sink coupled to the inverting input of the operational amplifier; and
   the switched capacitor circuit comprising:
       a capacitor; and
       first and second switches coupled on either side of the capacitor and controlled by an activation input, that charges the capacitor with a common mode voltage in a deactivated position and that couples the capacitor between the output of the operational amplifier and the control terminal of a corresponding transmission gate transistor in an activated position.

14. The track and hold circuit of claim 13, wherein the p-channel and n-channel transistors of the transmission gate comprise PMOS and NMOS transistors, respectively, and wherein a gamma parameter of the source follower circuit MOS transistor and a corresponding one of the transmission gate transistors is approximately equal.

15. The track and hold circuit of claim 11, the input signal comprising a differential input signal with positive and negative polarities, further comprising:
   the at least one dual pump sampling circuit including a first dual pump sampling circuit coupled to sample the positive polarity of the input signal and a second dual pump sampling circuit coupled to sample the negative polarity of the input signal;
   the at least one sampling capacitor comprising a first sampling capacitor having a first end coupled to a pump output of the first dual pump sampling circuit and a second sampling capacitor having a first end coupled to a pump output of the second dual pump sampling circuit; and the sample control circuit comprising:
- a differential amplifier having an inverting input coupled to a second side of the first sampling capacitor, a non-inverting input coupled to a second side of the second sampling capacitor, and an output;
- a feedback circuit including a first resistive switch coupled between the first end of the first sampling capacitor and the differential amplifier output and a second resistive switch coupled between the first end of the second sampling capacitor and the differential amplifier output; and
- a control circuit, coupled to the first and second dual pump sampling circuits and the feedback circuit, that operates in a periodic manner by activating the first and second dual pump sampling circuits and deactivating the feedback circuit during a first portion of each cycle and then by deactivating the first and second dual pump sampling circuits and activating the feedback circuit during a second portion of each cycle.

16. The track and hold circuit of claim 15, wherein the differential amplifier is fully differential having an inverting output and a non-inverting output, the amplifier control circuit further comprising:
- an input common mode circuit, coupled to the control circuit, including a switched input common mode voltage circuit coupled between the inverting and non-inverting inputs of the differential amplifier and activated by the control circuit during activation of the first and second dual pump sampling circuits; and
- an output common mode circuit, coupled to the control circuit, including a switched output common mode voltage circuit coupled between the inverting and non-inverting outputs of the differential amplifier and activated by the control circuit during activation of the input common mode circuit.

17. A track and hold circuit, comprising:
- an differential amplifier having a differential input and a differential output;
- a common mode input circuit coupled to the differential input of the differential amplifier;
- a common mode output circuit coupled to the differential output of the differential amplifier;
- a first sampling capacitor having a first end coupled to a first input polarity of the differential amplifier and a second end;
- a second sampling capacitor having a first end coupled to a second input polarity of the differential amplifier and a second end;
- a first feedback resistive device coupled between the second end of the first sampling capacitor and a first output polarity of the differential amplifier;
- a second feedback resistive device coupled between the second end of the second sampling capacitor and a second output polarity of the differential amplifier;
- a pair of dual pump circuits, each dual pump circuit having an input for sampling a corresponding polarity of a differential input signal and an output coupled to a second input of a corresponding one of the first and second sampling capacitors, each comprising:
  - a transmission gate including a p-channel device and an n-channel device, the p-channel device having a control terminal and a pair of current terminals coupled between a corresponding polarity of the differential input signal and the second input of the corresponding sampling capacitor and the n-channel device having a control terminal and a pair of current terminals coupled between a corresponding polarity of the differential input signal and the second input of the corresponding sampling capacitor;
  - an n-channel pump circuit having an input coupled to the corresponding polarity of the differential input signal and an output coupled to the control terminal of the n-channel device; and
  - a p-channel pump circuit having an input coupled to the corresponding polarity of the differential input signal and an output coupled to the control terminal of the p-channel device.

18. The track and hold circuit of claim 17, wherein the p-channel and n-channel devices of each dual pump circuit comprise metal oxide semiconductor (MOS) transistors.

19. The track and hold circuit of claim 17, wherein the first and second feedback resistive devices each comprise:
- a p-channel transistor having a control terminal and a pair of current terminals coupled between the second input of a corresponding one of the first and second sampling capacitors and a corresponding one of the first and second output polarities of the differential amplifier; and
- an n-channel device having a control terminal and a pair of current terminals coupled between the second input of a corresponding one of the first and second sampling capacitors and a corresponding one of the first and second output polarities of the differential amplifier.

20. The track and hold circuit of claim 17, wherein the p-channel and n-channel transistors of each of the pair of dual pump circuits have equivalent sizes.

21. The track and hold circuit of claim 17, wherein the p-channel and n-channel transistors of each of the pair of dual pump circuits have equivalent conductances.

22. The track and hold circuit of claim 17, wherein the n-channel and p-channel pump circuits each comprise:
- a MOS transistor having a control terminal and a pair of current terminals coupled between a supply voltage and a bias current source device;
- an operational amplifier coupled in a source follower configuration having a first polarity input receiving a corresponding polarity of the differential input signal, a second polarity input coupled to the bias current source device and an output coupled to the control terminal of the MOS transistor;
- a first switch having a common terminal and a switching terminal that switches at a predetermined rate between a common mode voltage and the output of the operational amplifier;
- a second switch having a common terminal and a switching terminal that switches at the predetermined rate between the supply voltage and the control terminal of a corresponding device of the transmission gate;
- a sampling capacitor coupled between the common terminals of the first and second switches;
- the first and second switches switching such that the first switch selects the common mode voltage while the second switch selects supply voltage to charge the sampling capacitor with a difference voltage between the supply voltage and the common mode voltage, and then switches so that the first switch selects the output of the operational amplifier while the second switch selects the control terminal of the corresponding one of the transmission gate devices; and
- a common mode MOS transistor coupled to apply the common mode voltage to the control terminal of the corresponding one of the transmission gate devices while the second switch selects the supply voltage.

* * * * *